US012638969B2

(12) United States Patent
Liao et al.

(10) Patent No.: US 12,638,969 B2
(45) Date of Patent: May 26, 2026

(54) DATA COMPRESSION METHOD AND FLASH MEMORY DEVICE

(71) Applicant: DapuStor Corporation, Shenzhen (CN)

(72) Inventors: Juming Liao, Shenzhen (CN); Xueming Cao, Shenzhen (CN); Yuanpeng Ma, Shenzhen (CN); Ying Yang, Shenzhen (CN)

(73) Assignee: DAPUSTOR CORPORATION, Shenzhen (CN)

( * ) Notice: Subject to any disclaimer, the term of this patent is extended or adjusted under 35 U.S.C. 154(b) by 0 days.

(21) Appl. No.: 18/677,357

(22) Filed: May 29, 2024

(65) Prior Publication Data

US 2024/0311005 A1     Sep. 19, 2024

Related U.S. Application Data

(63) Continuation of application No. PCT/CN2023/093999, filed on May 12, 2023.

(30) Foreign Application Priority Data

May 27, 2022     (CN) .......................... 202210594147.2

(51) Int. Cl.
*G06F 3/06* (2006.01)
(52) U.S. Cl.
CPC .......... *G06F 3/0608* (2013.01); *G06F 3/0659* (2013.01); *G06F 3/0679* (2013.01); *G11C 2207/102* (2013.01)

(58) Field of Classification Search
CPC .... G06F 3/0608; G06F 3/0659; G06F 3/0679; G11C 2207/102
See application file for complete search history.

(56) References Cited

U.S. PATENT DOCUMENTS 11,216,186 B1 *    1/2022   Armangau ............ G06F 3/0689
2013/0073798 A1 *    3/2013   Kang .................. G06F 12/0246
711/E12.008

(Continued)

FOREIGN PATENT DOCUMENTS

CN        107870728 A        4/2018
CN        110908608 A        3/2020
(Continued)

OTHER PUBLICATIONS pp. 796-797 from Memory Systems: Cache, DRAM, Disk by Bruce Jacob, et el. (Year: 2008).*

(Continued)

*Primary Examiner* — Janice M. Girouard
(74) *Attorney, Agent, or Firm* — Bayes PLLC

(57)        ABSTRACT

A data compression method is disclosed. The data compression method is applied to a flash memory device having a flash memory medium. The data compression method includes: reading at least two pieces of cold data in the flash memory medium; compressing the at least two pieces of cold data in the flash medium, so as to obtain at least two pieces of compressed data; splicing the at least two pieces of compressed data, so as to generate at least one write unit; and writing each of the at least one write unit into the flash memory medium.

20 Claims, 12 Drawing Sheets

(56)     References Cited

U.S. PATENT DOCUMENTS

| | | | | |
|---|---|---|---|---|
| 2014/0281129 | A1* | 9/2014 | Heller | G06F 3/068 |
| | | | | 711/162 |
| 2018/0032435 | A1* | 2/2018 | Parker | G06F 12/0833 |
| 2018/0152733 | A1* | 5/2018 | Karaje | H04N 19/14 |
| 2018/0267746 | A1* | 9/2018 | Itoh | G06F 3/061 |
| 2020/0097181 | A1* | 3/2020 | Volvovski | G06F 3/0604 |

FOREIGN PATENT DOCUMENTS

| | | |
|---|---|---|
| CN | 111125047 A | 5/2020 |
| CN | 114356225 A | 4/2022 |
| CN | 114968837 A | 8/2022 |

OTHER PUBLICATIONS

A Merriam-Webster screen shot that defines the verb concatenate (Year: 2022).*
Merriam-Webster definition of the term 'respectively' (Year: 2022).*
International Search Report and Written Opinion in related PCT Application No. PCT/CN2023/093999 dated Jun. 16, 2023 (6 pages).

* cited by examiner

S21

Reading at least two pieces of cold data in the flash medium

S22

Compressing the at least two pieces of cold data in the flash medium to obtain at least two pieces of compressed data

S23

Concatenating the at least two pieces of compressed data to generate at least one write unit

S24

Writing each write unit into the flash medium

DATA COMPRESSION METHOD AND FLASH MEMORY DEVICE

CROSS-REFERENCE TO RELATED APPLICATIONS

The present application is a continuation of International Application No. PCT/CN2023/093999, filed on May 12, 2023, which claims the benefit of priority to Chinese Patent Application No. 202210594147.2 filed on May 27, 2022. The entire contents of each of the above-referenced applications are expressly incorporated herein by reference.

TECHNICAL FIELD

The present disclosure relates to the field of storage device disclosures, and in particular to a data compression method and a flash memory device.

BACKGROUND

Flash memory devices, such as solid state drives (SSDs), are hard drives made up of solid-state electronic storage chip arrays. SSDs comprise control units and storage units (FLASH storage chips or DRAM storage chips). With the development of SSDs, the functionality of SSD firmware has become increasingly complex, with growing storage density and capacity demands. In addition to the expansion of system capacity (P2L tables, L2P tables, trim bitmap tables, and other metadata), there are also simulation data (dummy), raid protection data, etc., that occupy the entire space within the SSD, leading to reduced available capacity for users.

Typically, the method for expanding disk capacity involves increasing the number of NANDs, which in turn increases the overall user capacity of the disk. However, increasing the number of NANDs means increasing the cost of the SSD. As the storage density and capacity demands for SSDs continue to grow, a portion of the entire disk's capacity is, however, still used as the space for storing SSD system, as well as dummy data, raid protection data, etc., which further reduces the ultimate capacity available for users. Therefore, to enable SSDs to store more data, data compression methods have been introduced.

However, some of the existing compression techniques directly compress the data upon writing by the host, requiring a decompression process during subsequent data reads. This increases data read latency, thereby impacting the overall read IO performance of SSDs.

In light of this, there is an urgent need for improvements in the prior art.

SUMMARY

The embodiments of the present disclosure provide a data compression method and a flash memory device that address the technical issue of data read latency caused by the direct compression of data upon writing by the host, requiring decompression for subsequent data reads, thereby improving the overall read IO performance of the flash memory device.

To solve the technical problem, the embodiments of the present disclosure offer the following technical solutions:

In a first aspect, the embodiments of the present disclosure provide a data compression method, wherein the method is applied to a flash memory device comprising a flash medium, and the method comprises:

reading at least two pieces of cold data in the flash medium;

compressing the at least two pieces of cold data in the flash medium to obtain at least two pieces of compressed data;

concatenating the at least two pieces of compressed data to generate at least one write unit; and writing each of the at least one write unit into the flash medium.

In some embodiments, reading the at least two pieces of cold data in the flash medium, comprises:

acquiring a cold data table;

determining valid cold data within the cold data table based on the cold data table; and reading at least two pieces of valid cold data in the flash medium.

In some embodiments, determining, based on the cold data table, the valid cold data within the cold data table, comprises:

searching for a logical address of cold data in the cold data table; and determining the cold data as valid cold data if the cold data meets a preset condition, wherein the preset condition comprises: the logical address belonging to valid logical addresses.

In some embodiments, the method further comprises: deciding whether the logical address belongs to the valid logical addresses, which comprises:

determining that the logical address belongs to the valid logical addresses if a physical address corresponding to the logical address of the cold data is valid, the logical address of the cold data falls within a range of logical addresses corresponding to user data in the flash medium, and the logical address of the cold data has not been processed by a first erase command.

In some embodiments, the flash memory device comprises a high-speed cache module, and reading the cold data in the flash medium, comprises:

writing the cold data in the flash medium to the high-speed cache module according to a data granularity size of the data upon being written to the flash medium, wherein one piece of cold data corresponds to one data granularity size.

In some embodiments, the flash memory device comprises a data compression module, and compressing the at least two pieces of cold data in the flash medium to obtain the at least two pieces of compressed data, comprises:

acquiring the cold data in the flash medium from the high-speed cache module; and sending a data compression command to the data compression module, such that the data compression module compresses the at least two pieces of cold data in the flash medium, thereby obtaining the at least two pieces of compressed data.

In some embodiments, the flash memory device comprises a data reassembly module, and concatenating the at least two pieces of compressed data to generate the at least one write unit, comprises:

sending a data reassembly command to the data reassembly module after obtaining the at least two pieces of compressed data, such that the data reassembly module assembles the at least two pieces of compressed data to generate the at least one write unit, wherein each write unit comprises a header file, and the header file is used to record a starting position and a data length of each piece of compressed data within the write unit.

In some embodiments, assembling the at least two pieces of compressed data to generate the at least one write unit, comprises:

concatenating a first piece of compressed data with a next piece of compressed data to obtain a concatenation unit, and deciding whether a total data length of the concatenation unit is greater than a data length of one write unit;

if so, discarding a current piece of compressed data, considering the current concatenation unit as one write unit, and using the current piece of compressed data as a first piece of compressed data to continue the concatenation; and if not, concatenating the current piece of compressed data to the concatenation unit until the total data length of the current concatenation unit is greater than the total data length of one write unit.

In some embodiments, after discarding the current piece of compressed data, and if the total data length of the current concatenation unit is less than the total data length of one write unit, filling in with invalid data to make the total data length of the current concatenation unit equal to the total data length of one write unit.

In some embodiments, the method further comprises:

when reading data in the flash medium, and if the data is located in a write unit, decompressing the write unit, and determining, based on a header file of the write unit, a starting position and a data length of the data to read compressed data within the write unit.

In a second aspect, the embodiments of the present disclosure provide a flash memory device, wherein the flash memory device comprises:

a flash medium;

a data reading module for reading at least two pieces of cold data in the flash medium;

a data compression module for compressing the at least two pieces of cold data in the flash medium to obtain at least two pieces of compressed data;

a data reassembly module for concatenating the at least two pieces of compressed data to generate at least one write unit; and a data writing module for writing each of the at least one write unit into the flash medium.

In some embodiments, the flash memory device further comprises:

a high-speed cache module connecting the data reading module and the data compression module, wherein the high-speed cache module is configured to store the at least two pieces of cold data read from the flash medium by the data reading module; and the data compression module compresses the at least two pieces of cold data in the high-speed compression module.

In a third aspect, the embodiments of the present disclosure further provide a non-volatile computer-readable storage medium storing computer-executable instructions, wherein the computer-executable instructions are used to enable a flash memory device to execute the data compression method according to the first aspect.

The beneficial effects of the embodiments of the present disclosure are as follows: In contrast to the prior art, a data compression method provided by the embodiments of the present disclosure is applied to a flash memory device. The flash memory device comprises a flash medium, and the method comprises: reading at least two pieces of cold data in the flash medium; compressing the at least two pieces of cold data in the flash medium to obtain at least two pieces of compressed data; concatenating the at least two pieces of compressed data to generate at least one write unit; and writing each write unit into the flash medium. By acquiring and compressing cold data, while leaving hot data uncompressed, this approach ensures that subsequent reads of the hot data do not require decompression, and ensures that the IO performance of the hot data is not affected, thereby enhancing the overall read IO performance of the flash memory device.

BRIEF DESCRIPTION OF THE DRAWINGS

One or more embodiments are exemplified through images in the corresponding accompanying drawings. These exemplary illustrations do not impose limitations on the embodiments. Elements in the accompanying drawings with the same reference number are indicated to be similar elements, unless specifically stated otherwise. The images in the accompanying drawings are not to be construed as limiting in scale.

DETAILED DESCRIPTION

To make the objectives, technical solutions, and advantages of the present disclosure clearer and more comprehensible, the present disclosure is described in detail below in conjunction with the accompanying drawings and embodiments. It should be understood that the specific embodiments described herein are merely intended to explain the present disclosure and are not meant to limit the present disclosure. Based on the embodiments in the present disclosure, all other embodiments obtained by those of ordinary skill in the art without creative work shall fall within the protection scope of the present disclosure.

It should be noted that, unless conflicting, the various features in the embodiments of the present disclosure may be combined with each other, and they are all within the protection scope of the present disclosure. In addition, although functional modules have been divided in the schematic diagrams of apparatuses, and logical sequences have been shown in the flowcharts, in some cases, the steps shown or described may be executed in an order different from the division of modules in the device or the sequence in the flowcharts. Moreover, the terms such as "first", "second", and "third" used herein do not limit the data and execution order but merely distinguish between similar items or the same items with essentially the same function and effect.

Figure 1:
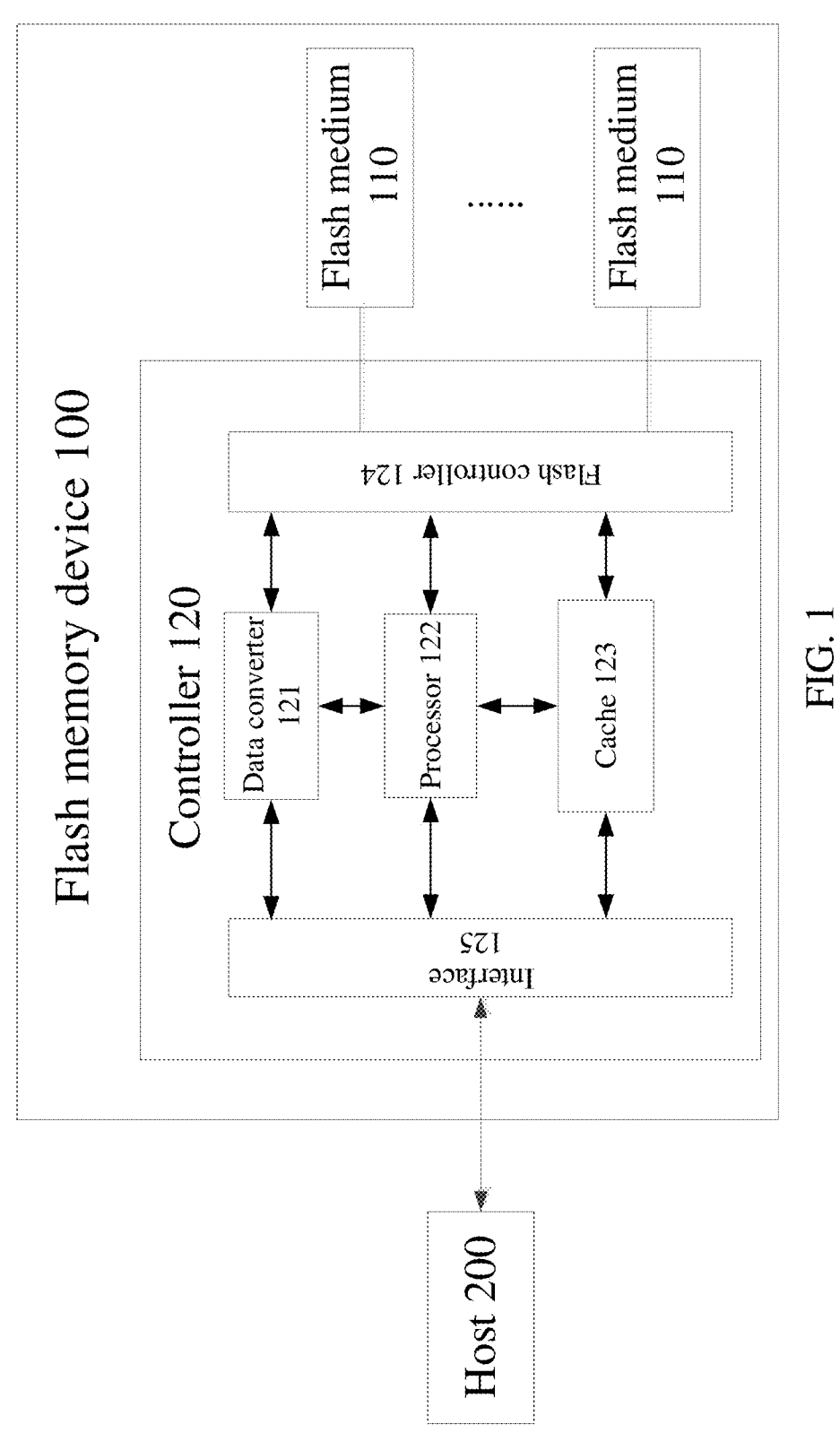
FIG. 1 is a schematic structural diagram of a flash memory device disclosed according to the embodiments of the present disclosure.

The technical solutions of the present disclosure are described below in conjunction with the accompanying drawings of the description:

Referring to FIG. 1, FIG. 1 is a schematic structural diagram of a flash memory device disclosed according to the embodiments of the present disclosure.

As shown in FIG. 1, the flash memory device 100 comprises flash medium 110 and a controller 120 connected to the flash medium 110. The flash memory device 100 is in communication connection with the host 200 through wired or wireless means to achieve data exchange.

The flash medium 110, serving as the storage medium of the flash memory device 100, is also known as flash memory, flash, flash storage, or flash dies. It belongs to a type of memory device and is a non-volatile memory that can retain data for extended periods even without a power supply. The storage characteristics of the flash medium 110 are similar to hard drives, making it the foundation of the storage medium in various portable digital devices.

The controller 120 comprises a data converter 121, a processor 122, a cache 123, a flash controller 124, and an interface 125.

The data converter 121 is connected to both the processor 122 and the flash controller 124. The data converter 121 is configured to convert binary data to hexadecimal data and vice versa. In some embodiments, when the flash controller 124 writes data to the flash medium 110, it converts the binary data to be written to hexadecimal data using the data converter 121 and then writes the data into the flash medium 110. When the flash controller 124 reads data from the flash medium 110, it converts the hexadecimal data stored in the flash medium 110 to binary data using the data converter 121, and then reads the converted data from the binary data page register. The data converter 121 may comprise a binary data register and a hexadecimal data register. The binary data register may be configured to store data converted from hexadecimal to binary, and the hexadecimal data register may be configured to store data converted from binary to hexadecimal.

The processor 122 is connected to the data converter 121, the cache 123, the flash controller 124, and the interface 125, respectively. The processor 122 can be connected to the data converter 121, the cache 123, the flash controller 124, and the interface 125 through a bus or other means. The processor is configured to run non-volatile software programs, instructions, and modules stored in the cache 123 to implement any one of the method embodiments in the present disclosure.

The cache 123 is configured primarily to cache read/write instructions sent by the host 200 and the read or write data obtained from the flash medium 110 based on the read/write instructions sent by the host 200.

The flash controller 124 is connected to the flash medium 110, the data converter 121, the processor 122, and the cache 123. The flash controller is configured to access the backend flash medium 110 and manage various parameters and data I/O of the flash medium 110; or to provide access interfaces and protocols, implement the corresponding SAS/

SATA target protocol end or NVMe protocol end, obtain I/O instructions sent by the host 200, and decode and generate internal private data results for execution; or to be responsible for the core processing of flash translation layer (FTL).

The interface 125 is connected to the host 200, the data converter 121, the processor 122, and the cache 123. The interface is configured to receive data sent by the host 200 or data sent by the processor 122, implementing data transmission between the host 200 and the processor 122. The interface 125 may be in the form of SATA-2 interface, SATA-3 interface, SAS interface, MSATA interface, PCI-E interface, NGFF interface, CFast interface, SFF-8639 interface, and M.2 NVME/SATA protocols.

It is understandable that, in SSD systems, the number of NANDs determines the total capacity of the disk, with each disk having a fixed capacity after manufacture that cannot be further expanded. The types of data that occupy disk capacity primarily include the following:

1. user capacity, which refers to the capacity occupied by the data stored in the SSD, which is written by the user through a host;

2. system data, comprising metadata, l2p tables, p2l tables, bad block tables, trim bitmap tables, etc.;

3. Logzone data, which refers to the data occupying space for recording system operation logs; and 4. dummy data and other protection data.

Disk capacity mainly stores the above four types of data. System data, Logzone, dummy data, and the like are types of data that are essential for the storage safety, persistence, and increased stability of user data. Each SSD product has a fixed user-accessible capacity that cannot be expanded to offer additional capacity for user use; it is also impossible for the user to write more data, as the system will report errors directly to prevent data that will exceed the space from being written to the SSD.

Therefore, to increase user capacity without adding NAND dies, data is usually compressed. However, some of the existing compression techniques directly compress the data upon writing by the host, requiring a decompression process during subsequent data reads. This increases data read latency, thereby impacting the overall read IO performance of SSDs.

Based on this, the embodiments of the present disclosure provide a data compression method to improve the overall read I/O performance of flash memory devices.

Figure 2:
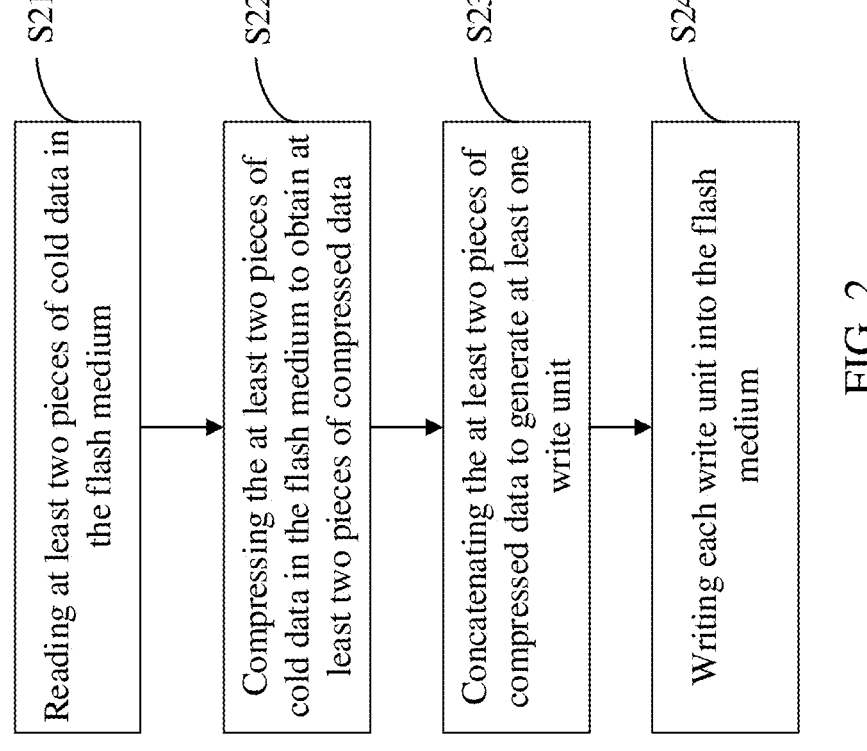
FIG. 2 is a schematic diagram illustrating the process of a data compression method disclosed according to the embodiments of the present disclosure.

Referring to FIG. 2, FIG. 2 is a schematic diagram illustrating the process of a data compression method disclosed according to the embodiments of the present disclosure.

The data compression method is applied to flash memory devices, which comprise flash media.

As shown in FIG. 2, the data compression method comprises:

Step S21: Reading at least two pieces of cold data in the flash medium.

It is understandable that cold data refers to user data that is infrequently used in the flash memory device. Compressing this part of data in the backend generally does not affect the write performance of the flash memory device.

Figure 3:
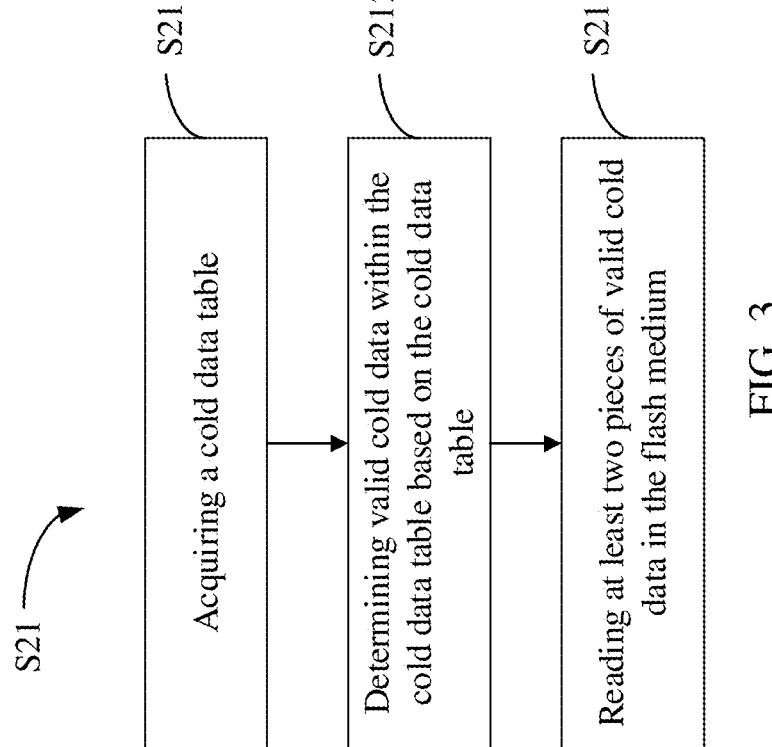
FIG. 3 is an elaborated flowchart of step S21 in FIG. 2.

Referring to FIG. 3, FIG. 3 is an elaborated flowchart of step S21 in FIG. 2.

As shown in FIG. 3, step S21, which involves reading at least two pieces of cold data in the flash medium, comprises:

Step S211: Acquiring a cold data table.

In some embodiments, the cold data table is used to store all the cold data in the flash memory device along with the logical addresses of the cold data, such as the logic mapping address (LMA). The cold data table is obtained through processing with a cold-hot data module, which is configured to run an algorithm that traverses cold and hot data. The algorithm that traverses cold and hot data calculates to obtain the cold data table. The algorithm that traverses cold and hot data is used to distinguish between cold data and hot data. Its fundamental operating principle involves making decisions based on parameters such as the timestamps of data reads and writes, the number of reads, and other parameters related to the cold-hot status, and deciding whether the data is cold data or hot data.

Step S212: Determining, based on the cold data table, valid cold data within the cold data table.

In some embodiments, it involves determining, based on the cold data table, all the cold data within the cold data table, and determining, based on all the cold data, all the valid cold data.

In the embodiments of the present disclosure, determining, based on the cold data table, the valid cold data within the cold data table, comprises:

searching for a logical address of cold data in the cold data table; and determining the cold data as valid cold data if the cold data meets a preset condition, wherein the preset condition comprises: the logical address belonging to valid logical addresses.

In the embodiments of the present disclosure, the method further comprises: deciding whether the logical address belongs to valid logical addresses, which specifically comprises:

determining that the logical address belongs to valid logical addresses if the physical address corresponding to the logical address of the cold data is valid, the logical address of the cold data falls within the range of logical addresses in the flash medium, and the logical address of the cold data has not been processed by a first erase command.

Figure 4:
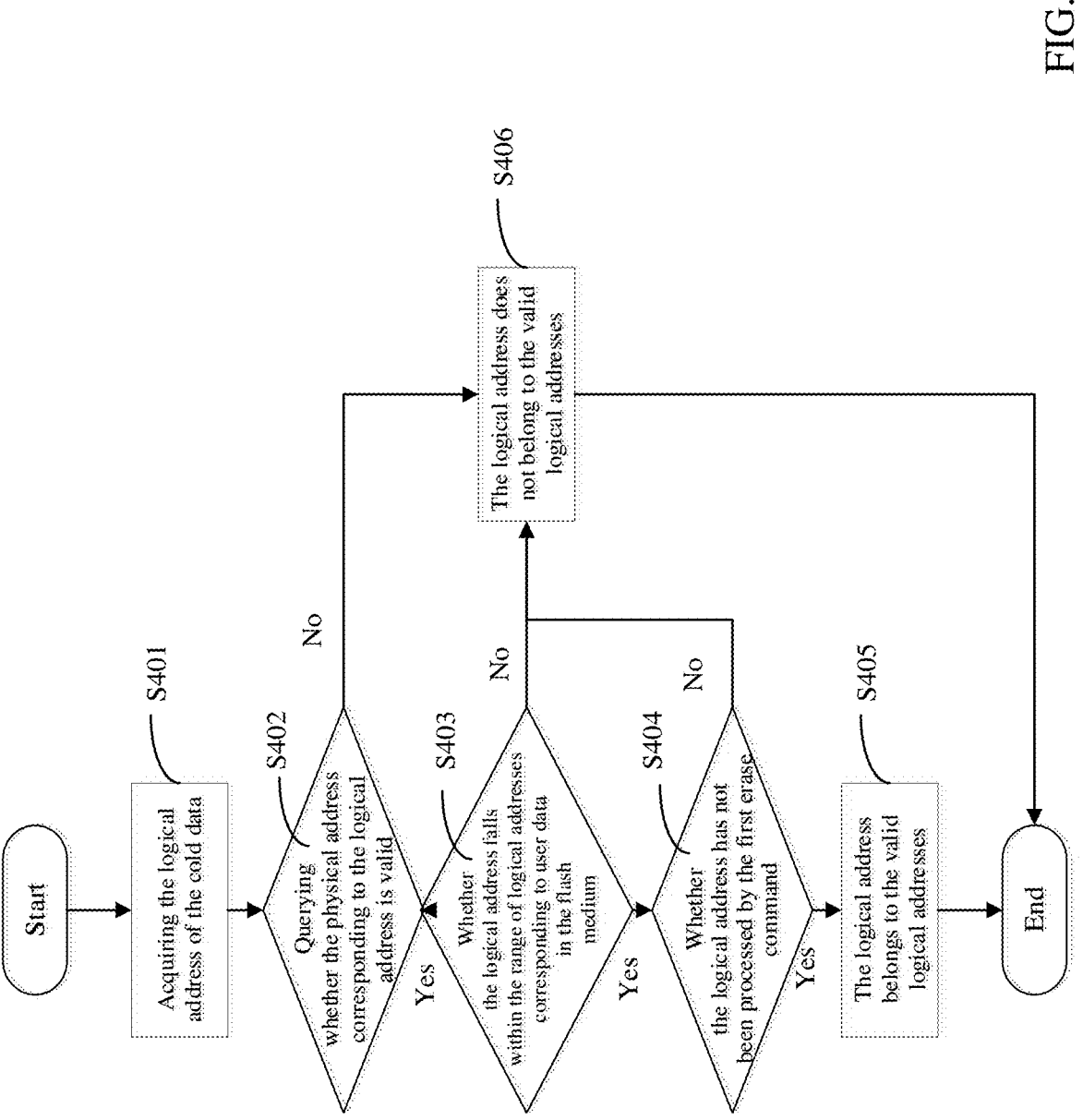
FIG. 4 is a schematic diagram illustrating the process of determining valid logical addresses disclosed according to the embodiments of the present disclosure.

Referring to FIG. 4, FIG. 4 is a schematic diagram illustrating the process of determining valid logical addresses disclosed according to the embodiments of the present disclosure.

As shown in FIG. 4, the process for determining valid logical addresses comprises:

Start.

Step S401: Acquiring the logical address of the cold data.

In some embodiments, the logical address comprises the logic mapping address (LMA).

Step S402: Querying whether the physical address corresponding to the logical address is valid.

In some embodiments, the flash memory device maintains one address mapping relationship, which is represented by an address mapping table. The address mapping table comprises the mapping relationship between logical addresses and physical addresses. The physical address comprises the physical mapping address (PMA). For example, the address mapping relationship comprises the mapping between the logic mapping address (LMA) and the physical mapping address (PMA) of the flash array. By querying the physical address corresponding to the logical address, it is decided whether the physical address is valid.

If the physical address corresponding to the queried logical address is valid, then proceed to step S403.

If the physical address corresponding to the queried logical address is invalid, then proceed to step S406.

Step S403: Whether the logical address falls within the range of logical addresses corresponding to user data in the flash medium.

In some embodiments, it involves deciding whether the logical address corresponding to the cold data falls within the range of logical addresses where the user data is located in the flash medium. It is understandable that user data corresponds to the range of a segment of logical addresses. By deciding whether the logical address corresponding to the cold data falls within the range, it may be determined whether the cold data is user data, that is, whether the cold data is user data, i.e., whether the cold data is located within the user data area.

If the logical address falls within the range of logical addresses corresponding to user data in the flash medium, then proceed to step S404.

If the logical address falls within the range of logical addresses corresponding to user data in the flash medium, then proceed to step S406.

Step S404: Whether the logical address has not been processed by the first erase command.

In some embodiments, the first erase command comprises the trim command. The trim command is a SATA interface instruction that informs the flash memory device which data to erase, and is a technical instruction belonging to the ATA8-ACS specification.

In the embodiments of the present disclosure, the flash memory device maintains one trim table, and deciding whether the logical address has not been processed by the first erase command comprises: querying the trim table of the flash memory device to determine whether the logical address has been processed by a trim command.

If the logical address has been processed by the trim command, then it is determined that the logical address has been processed by the first erase command, and proceed to step S406.

If the logical address has not been processed by the trim command, then it is determined that the logical address has not been processed by the first erase command, and proceed to step S405.

Step S405: The logical address belongs to the valid logical addresses.

In some embodiments, if the logical address belongs to the valid logical addresses, then it is determined that the cold data corresponding to the logical address is valid cold data.

Step S406: The logical address does not belong to the valid logical addresses.

In some embodiments, if the logical address does not belong to the valid logical addresses, then it is determined that the cold data corresponding to the logical address does not belong to valid cold data.

End.

It should be noted that the sequence of the three deciding steps—querying whether the physical address corresponding to the logical address is valid; whether the logical address falls within the range of logical addresses in the flash medium; and whether the logical address has not been processed by the first erase command—is not restricted. For example, it may be first decided whether the logical address falls within the range of logical addresses in the flash medium, then decide whether the physical address corresponding to the logical address is valid, or follows some other deciding sequence. In some embodiments, the three deciding steps may be processed simultaneously, that is, all three deciding steps are performed at the same time. Both approaches fall within the protection scope of the present disclosure.

Step S213: Reading at least two valid cold data in the flash medium.

In some embodiments, it involves reading at least two pieces of valid cold data in the flash medium after determining all valid cold data in the flash medium. Preferably, all valid cold data in the flash medium is read.

In the embodiments of the present disclosure, the flash memory device comprises a high-speed cache module, and reading the cold data in the flash medium, comprises:

writing the cold data in the flash medium to the high-speed cache module according to the data granularity size of the data upon being written to the flash medium, wherein one piece of cold data corresponds to one data granularity size. In some embodiments, it involves writing the valid cold data in the flash medium to the high-speed cache module according to the data granularity size of the data upon being written to the flash medium.

In the embodiments of the present disclosure, the sizes of data granularity comprise multiples of 4112 bits, multiples of 4160 bits, and multiples of 4224 bits, among all relevant data format sizes, which are not limited herein.

For example, if the data granularity size of the data upon being written to the flash medium is 4 KB, then the space size corresponding to each piece of cold data is 4 KB. In this case, each piece of cold data with the size of 4 KB is written to the high-speed cache module.

In the embodiments of the present disclosure, the high-speed cache module comprises a dynamic random access memory, such as a double data rate synchronous dynamic random access memory (DDR SRAM).

Step S22: Compressing at least two pieces of cold data in the flash medium to obtain at least two pieces of compressed data.

Figure 5:
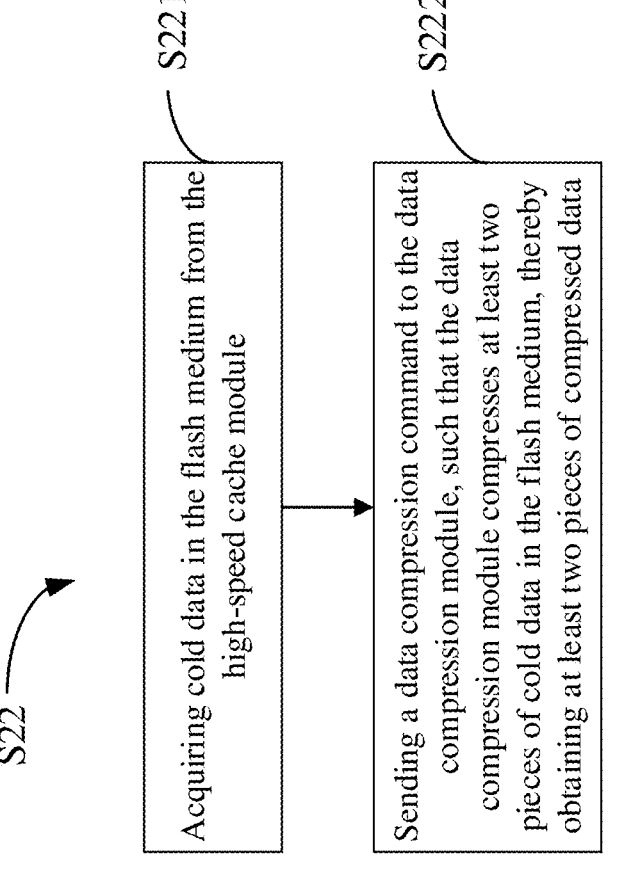
FIG. 5 is an elaborated flowchart of step S22 in FIG. 2.

In some embodiments, the flash memory device comprises a data compression module. Referring to FIG. 5, FIG. 5 is an elaborated flowchart of step S22 in FIG. 2.

As shown in FIG. 5, step S22, which involves compressing at least two pieces of cold data in the flash medium to obtain at least two pieces of compressed data, comprises:

Step S221: Acquiring cold data in the flash medium from the high-speed cache module.

In some embodiments, it involves reading the valid cold data in the flash medium from the high-speed cache module.

Step S222: Sending a data compression command to the data compression module, such that the data compression module compresses at least two pieces of cold data in the flash medium, thereby obtaining at least two pieces of compressed data.

In some embodiments, it involves sending a data compression command to the data compression module, such that the data compression module compresses at least two pieces of cold data in the flash medium, thereby obtaining at least two pieces of compressed data, i.e., at least two pieces of compressed valid cold data. Here, the data compression module compresses the valid cold data in the high-speed cache module, obtaining each piece of compressed valid cold data. The compressed valid cold data is then used for further assembly, in order to be written into the flash medium.

For example, compressing at least two pieces of cold data in the flash medium, comprises: compressing each piece of cold data in the flash medium, with the compression process being carried out by the data compression module. It is understandable that the length of the compressed data is determined by a compression algorithm, and different compression algorithms or different data patterns may result in varying lengths of compressed data.

Figure 6:
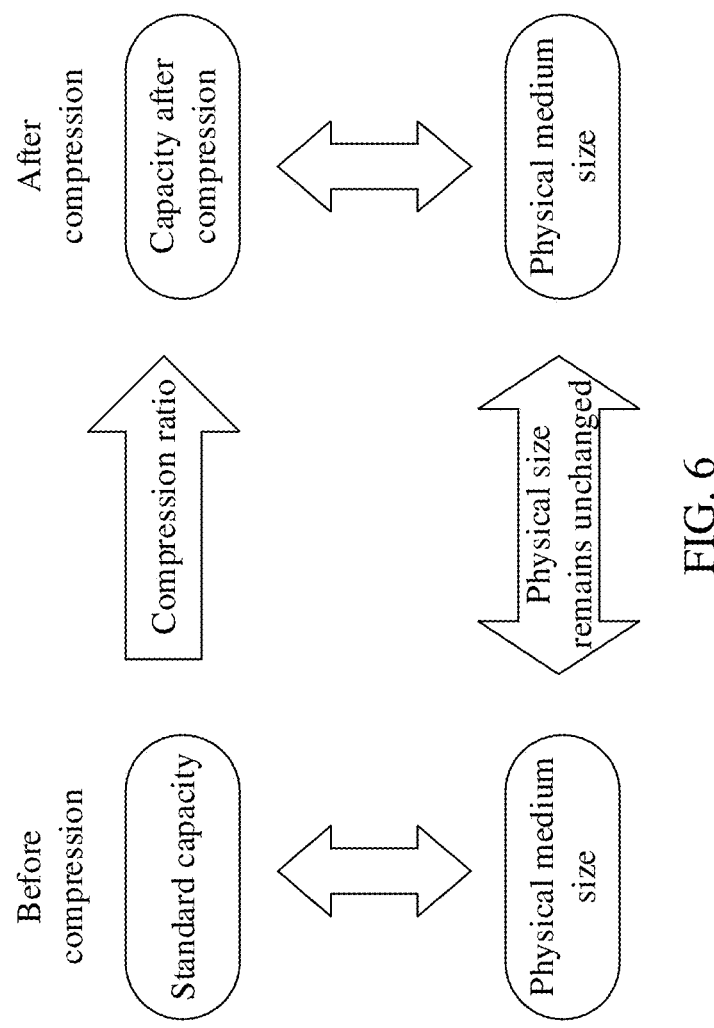
FIG. 6 is a schematic diagram illustrating the states before and after compression disclosed according to the embodiments of the present disclosure.

Referring to FIG. 6, FIG. 6 is a schematic diagram illustrating the states before and after compression disclosed according to the embodiments of the present disclosure.

As shown in FIG. 6, the size of the physical media remains unchanged before and after compression, that is, the physical space of the flash memory does not change. However, the standard capacity before compression is different from the capacity after compression, with the capacity after compression being greater than the standard capacity before compression. The ratio of the two is known as the compression ratio.

Step S23: Concatenating at least two pieces of compressed data to generate at least one write unit.

In some embodiments, the flash memory device comprises a data reassembly module, which is configured to concatenate compressed data. In some embodiments, concatenating at least two pieces of compressed data to generate at least one write unit, comprises:

sending a data reassembly command to the data reassembly module after obtaining at least two pieces of compressed data, such that the data reassembly module assembles the at least two pieces of compressed data to generate at least one write unit, wherein, each write unit comprises a header file, and the header file is used to record the starting position and the data length of each piece of compressed data within the write unit.

For example, after obtaining at least two pieces of compressed valid cold data, a data reassembly command is sent to the data reassembly module, such that the data reassembly module assembles at least two pieces of compressed valid cold data to generate at least one write unit.

In the embodiments of the present disclosure, assembling at least two pieces of compressed data to generate at least one write unit, comprises:

concatenating the first piece of compressed data with the next piece of compressed data to obtain a concatenation unit, and deciding whether the total data length of the concatenation unit is greater than the data length of one write unit;

if so, discarding the current piece of compressed data, considering the current concatenation unit as one write unit, and using the current piece of compressed data as the first piece of compressed data to continue the concatenation; and if not, concatenating the current piece of compressed data to the concatenation unit until the total data length of the current concatenation unit is greater than the total data length of one write unit.

Figure 7:
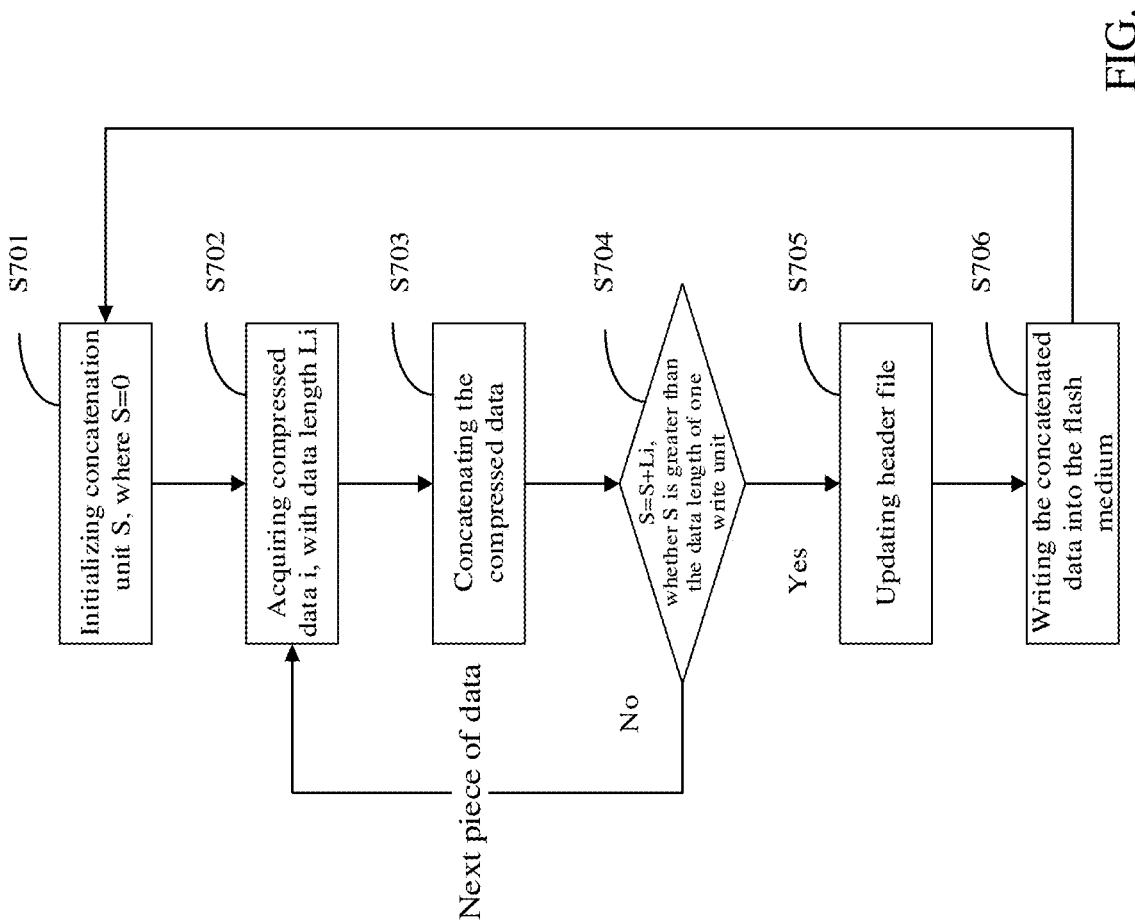
FIG. 7 is a schematic diagram illustrating the process of data concatenation disclosed according to the embodiments of the present disclosure.

Referring to FIG. 7, FIG. 7 is a schematic diagram illustrating the process of data concatenation disclosed according to the embodiments of the present disclosure.

As shown in FIG. 7, the process of data concatenation comprises:

Step S701: Initializing concatenation unit S, where S=0.

In some embodiments, it involves initializing a concatenation unit S, such that the initial data length of the concatenation unit S is 0.

Step S702: Acquiring compressed data i, with data length $L_i$;

In some embodiments, it involves acquiring the $i^{th}$ piece of compressed data, with i being a positive integer. For example, starting with i=1, then the first piece of compressed data is acquired, with the data length corresponding to the first piece of compressed data being L0.

Step S703: Concatenating the compressed data.

In some embodiments, it involves concatenating the first piece of compressed data with the concatenation unit. In this case, the data length of the concatenation unit S=0+L0=L0, which is the data length corresponding to the first piece of compressed data.

Step S704: S=S+Li, whether S is greater than the data length of one write unit.

In some embodiments, it involves deciding whether the data length of the concatenation unit is greater than the data length of one write unit. If the data length of the concatenation unit is not greater than that of a write unit, then return to step S702 to acquire the next piece of compressed data and concatenate the next piece of compressed data with the concatenation unit. For example: concatenate the first piece of compressed data with the next piece of compressed data to obtain a concatenation unit, and decide whether the total data length of the concatenation unit is greater than the data length of one write unit, and so on, until the total data length of the concatenation unit is greater than the data length of one write unit.

If the total data length of the concatenation unit is greater than the data length of one write unit, in this case, discard the current piece of compressed data to obtain the currently concatenated concatenation unit. The total data length of the currently concatenated concatenation unit may be equal to or less than the data length of one write unit. If the total data length of the current concatenation unit is less than the total data length of one write unit, then fill in with invalid data (dummy) to make the total data length of the current concatenation unit equal to the total data length of one write unit.

In the embodiments of the present disclosure, the data length of one write unit is related to the number of bits stored by one storage unit of the flash memory device. Base on the number of bits stored by one storage unit of the flash memory device, it can be classified as single-level cell (SLC), multi-level cell (MLC), or trinary-level cell (TLC). Here, SLC means a single storage unit stores 1 bit of data, MLC means a single storage unit stores 2 bits of data, and TLC means a single storage unit stores 3 bits of data. For example, if one storage unit of the flash memory device stores 1 bit, then set the data length of one write unit to 64 KB; if one storage unit of the flash memory device stores 2 bits, then set the data length of one write unit to 80 KB; if one storage unit of the flash memory device stores 3 bits, then set the data length of one write unit to 96 KB.

In some embodiments, the data length of one write unit is the product of the data size of each data page in the flash memory device and the number of planes of the flash die. Here, a plane is the smallest unit in a flash memory device that may operate based on commands such as read, write, and erase. One plane is one storage matrix, comprising several physical blocks. A physical block is the smallest erase unit of a flash memory device (NAND Flash), and one physical block comprises several physical pages. A physical page is the smallest read-write unit of a flash memory device (NAND Flash), and one physical page comprises several bytes.

Figure 8:
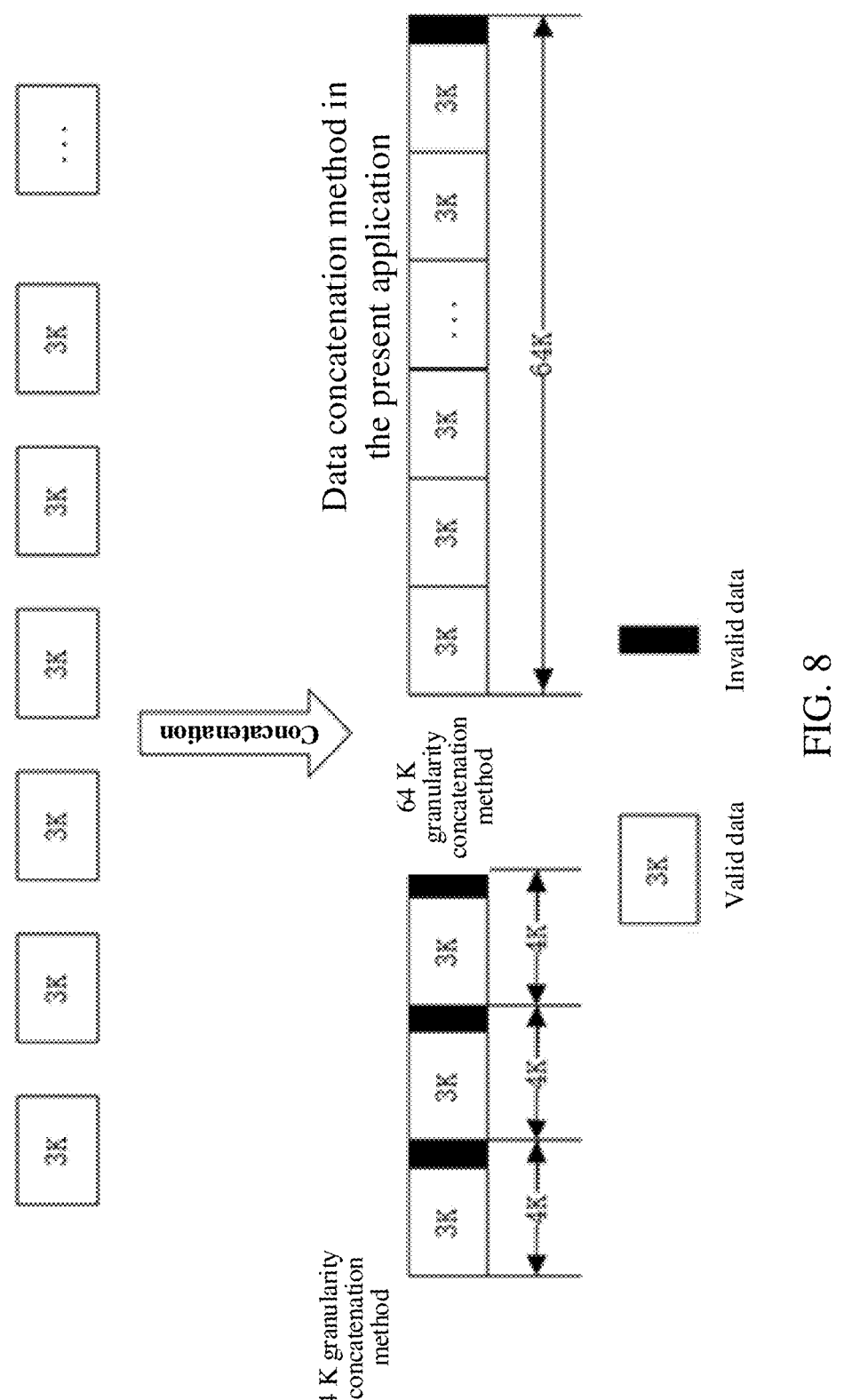
FIG. 8 is a schematic diagram of data concatenation disclosed according to the embodiments of the present disclosure.

Referring to FIG. 8, FIG. 8 is a schematic diagram of the data concatenation disclosed according to the embodiments of the present disclosure.

Assume that the data length of one write unit is 64 KB, and the data length of each piece of compressed data is 3 KB.

As shown in FIG. 8, the concatenation method on the left is a 4 K granularity concatenation method, and the one on the right is the data concatenation method in the present disclosure, namely a 64 K granularity concatenation method. It can be seen that, compared to the 4 K granularity concatenation method, every piece of compressed data in the present disclosure is tightly connected without interspersed invalid data, which results in a smaller proportion of invalid data in the concatenated data. Therefore, the present disclosure can reduce the proportion of invalid data in NAND. Moreover, since the data length of one write unit is 64 KB or more, the present disclosure can handle data with a very low compression ratio. For example, if the compression ratio is fixed and a piece of data of 4096 bits is compressed into 3000 bits, then the 64 K granularity may accommodate 23 pieces of compressed data. In contrast, for the 4 K granularity, a piece of data of 3000 bits would occupy one 4 K space, effectively uncompressed, and a 64 K space could only store 16 pieces of compressed data. The present disclosure can improve the data storage rate.

If the total data length of the concatenation unit is greater than the data length of one write unit, then proceed to step S705.

If the total data length of the concatenation unit is not greater than the data length of one write unit, then return to step S702.

Step S705: Updating the header file.

In some embodiments, each write unit corresponds to one header file, and after completing the data concatenation for one write unit, the header file (extern header) needs to be updated.

Figure 9:
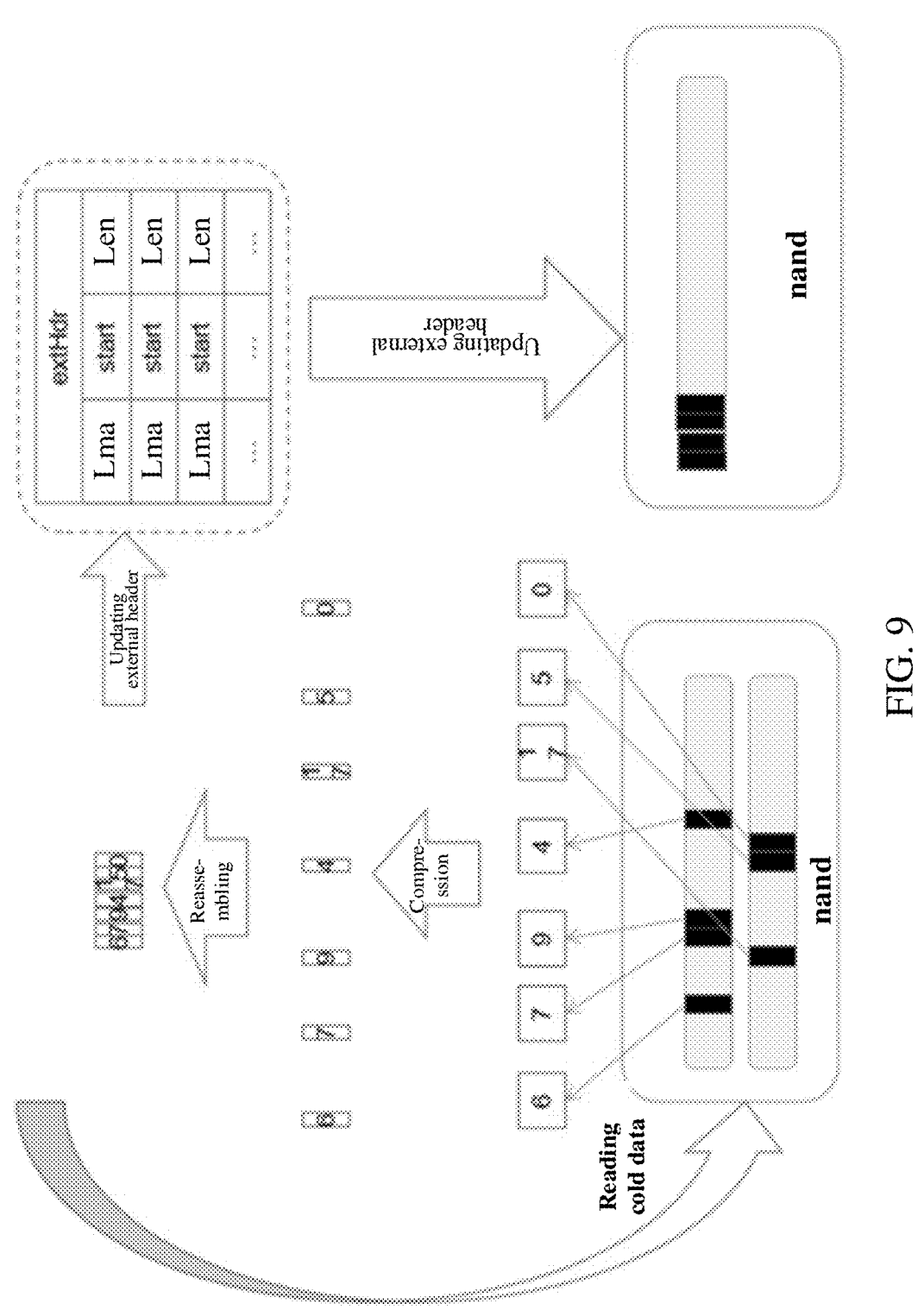
FIG. 9 is a schematic diagram of updating a header file disclosed according to the embodiments of the present disclosure.

Referring to FIG. 9, FIG. 9 is a schematic diagram of updating a header file disclosed according to the embodiments of the present disclosure.

As shown in FIG. 9, in the embodiments of the present disclosure, through the addition of a new header file structure (extern header structure) to store information about the compressed data, the length of each piece of data after compression and the specific position of the reassembled data where it located is recorded. In some embodiments, the header file is used to record the starting position and the data length of each piece of compressed data within the write unit. For example, the header file comprises the logical address of each piece of compressed data, the starting position (start) within the write unit, and the data length, wherein the logical address comprises the logic mapping address (LMA).

In the embodiments of the present disclosure, the header file (extern header structure data) is stored at the starting position of each write unit.

It is understandable that when it becomes necessary to read cold data later, the specific position of each piece of user data may be obtained through the header file information, which allows the data required by users to be output to the host. If the compressed data may be reassembled into a NAND write unit, then the compressed data along with the extern header are written into NAND.

For example, if LMA 0, 4, 5, 6, 7, 9, and 17 are cold data as well as valid data, the data is first read out from NAND and sent for compression, then a write unit is constructed based on the actual conditions, and the header file is updated, that is, updating the position and length information of the compressed data. Finally, the compressed data is written into the flash medium.

In the embodiments of the present disclosure, a piece of cold data, such as LMA 0, originally has a size of 4 K. "Start" refers to the starting position of this piece of cold data in the current piece of compressed data, and "len" refers to the data length, i.e., the length information. Based on the starting position and the length information, the compressed data of a certain piece of cold data may be acquired. Thus, by decompressing the compressed data, the original 4 K size data may be restored.

Step S706: Writing the concatenated data into the flash medium.

In some embodiments, the total length of the concatenated data, i.e., the data of the concatenation unit, may be equal to or less than the data length of one write unit. If it is less than the data length of one write unit, then fill in with invalid data (dummy) to make the total data length of the concatenated data equal to the data length of one write unit, thereby writing one write unit into the flash medium.

Step S24: Writing each write unit into the flash medium.

Assume a reassembled write unit consists of multiple 4 K that have been compressed and assembled, and the size of the write unit is 64 K. Then, if multiple pieces of compressed data added together can reach 64 K, then they can form one write unit. If they can not reach 64 K, then it is necessary to continue to wait for the subsequent compressed data to accumulate to 64 K, or fill in with invalid data (NAND) until the data size meets 64 K, at which point a write command is sent to NAND for writing the data.

Figure 10:
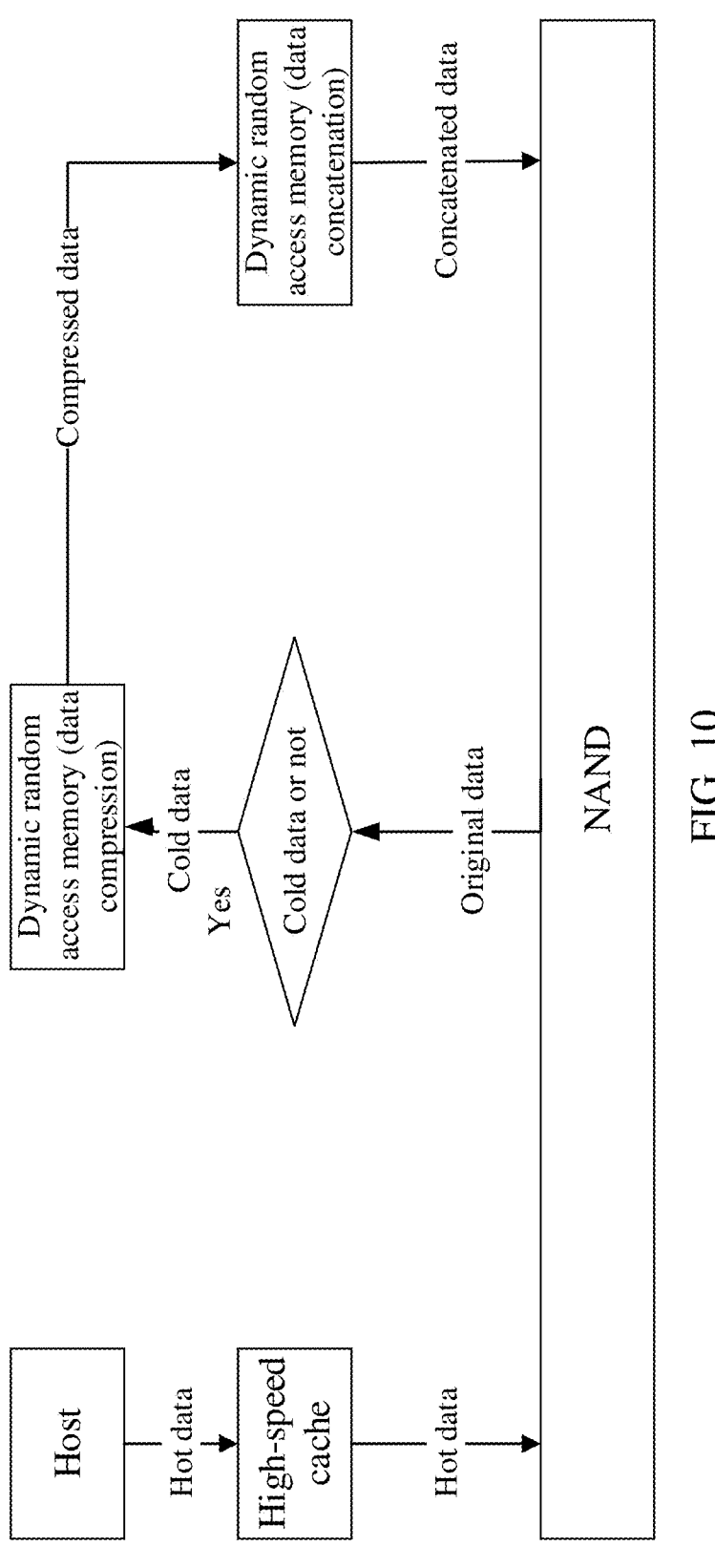
FIG. 10 is a schematic diagram of a data flow disclosed according to the embodiments of the present disclosure.

Referring to FIG. 10, FIG. 10 is a schematic diagram of a data flow disclosed according to the embodiments of the present disclosure.

As shown in FIG. 10, the data flow is from the host to the high-speed cache of the flash memory device, where hot data is written. The high-speed cache writes the hot data into the flash medium (NAND). The flash controller acquires the original data from the flash medium (NAND) and decides if the original data is cold data. If it is cold data, then the cold data is written into the dynamic random access memory, and the data is compressed in the dynamic random access memory to obtain the compressed data. Moreover, the compressed data is concatenated in the dynamic random access memory, and the concatenated data is written into the flash medium (NAND).

It is understandable that the data source of the host is generally 4096 bits (equivalent to 4 K). The current NIDA hardware incorporates front end cyclic redundancy check (FCRC) and metadata, wherein the FCRC serves as an error-checking code, and the corresponding space size for the FCRC is 8 bits; metadata refers to data used to describe the attributes of data and the environment thereof, for example, it stores information such as the storage position sent by the front end and historical data, wherein the corresponding space size for the metadata is 8 bits. Based on the 512 format and 4 K set by the host, there are three assembled sizes of formats, namely multiples of 4112 bits, multiples of 4160 bits, and multiples of 4224 bits. Therefore, software compression needs to be performed according to these data sizes and multiples, that is, the data size at the compression entry point should be multiples of 4112 bits, multiples of 4160 bits, and multiples of 4224 bits, among all relevant data format sizes.

In the embodiments of the present disclosure, since cold data refers to user data that is infrequently used in the flash memory device, compressing this part of data in the backend generally does not affect the write performance of the flash memory device. Therefore, compressing cold data may reduce the space in NAND that actual data occupies, increase the volume of data that can be written, and expand usage capacity for users without adding NAND dies, that is, increase the amount of data users can write. Moreover, the compressed data is reassembled with the size of one write unit, and each piece of software-compressed data is tightly connected without interspersed invalid data, thereby decreasing the proportion of invalid data in NAND, and effectively enhancing the data compression effect.

Figure 11:
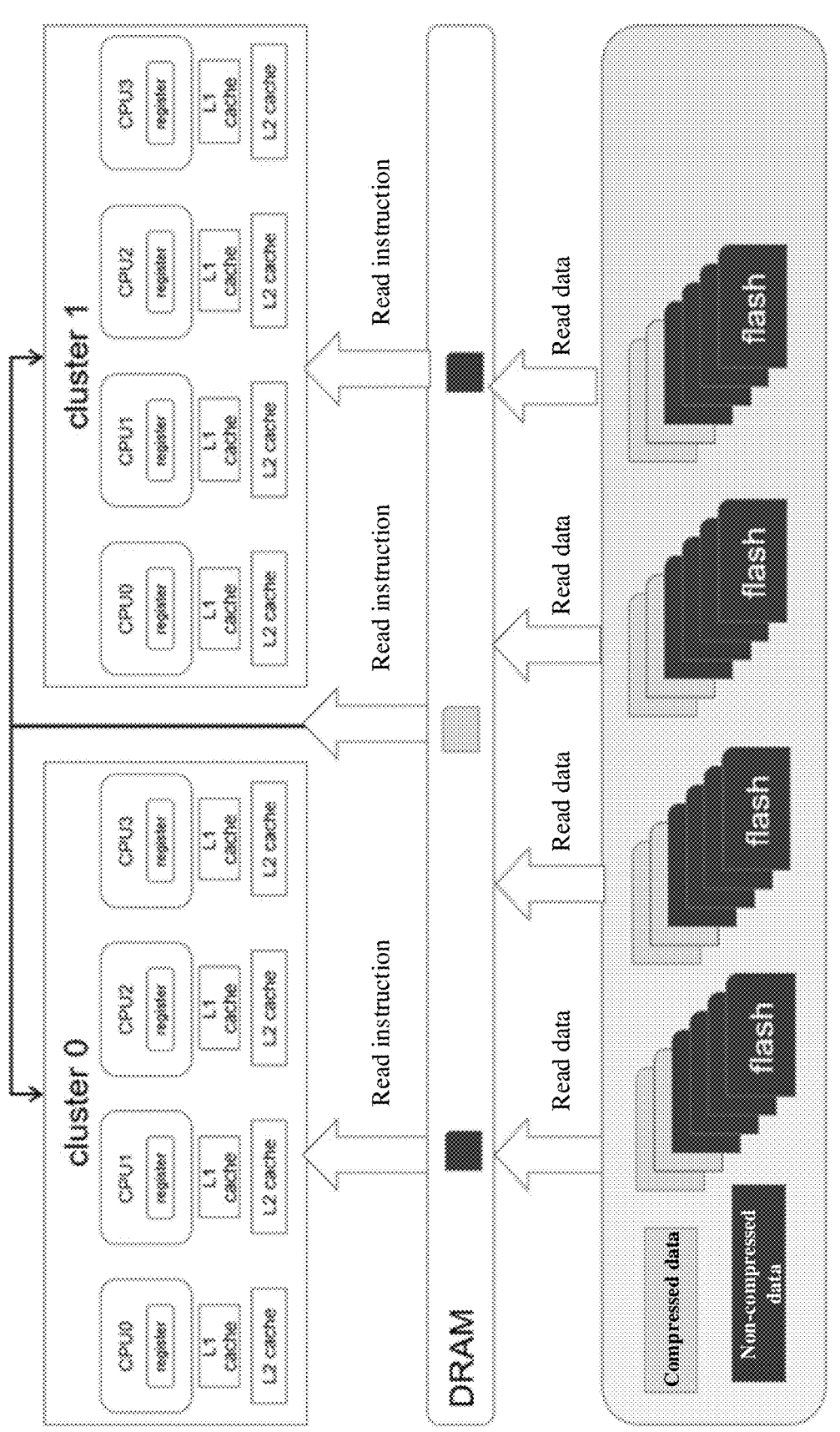
FIG. 11 is a schematic diagram of reading data disclosed according to the embodiments of the present disclosure.

Referring to FIG. 11, FIG. 11 is a schematic diagram of reading data disclosed according to the embodiments of the present disclosure.

As shown in FIG. 11, if a user reads hot data (hotspot data), since hot data is not compressed, the reading process is unaffected, which does not require passing through the decompression module, and thus, latency performance remains unaffected. If a user reads cold data, i.e., compressed data, then it requires the decompression module to perform the decompression operation to enable the reading of the compressed cold data. In some embodiments, when reading data in the flash medium, if the data is located in a write unit, then the write unit is decompressed, and based on the header file of the write unit, the starting position and the data length of the data is determined to read the compressed data within the write unit.

For example, if the host needs to read certain data, it determines the write unit in the flash medium where the data is located based on the data's logical position. In this case, the write unit is decompressed, and the starting position and the data length are obtained based on the header file information (extern header field) from the header file of the write unit. Finally, the data obtained after decompression is sent to the host. Preferably, after determining that the data is located in a write unit of the flash medium, the header file information from the header file of the write unit is read. Based on the header file information, the starting position and the data length are determined. The data is decompressed to send the data to the host, thereby avoiding the direct decompression of the entire write unit. This improves the efficiency of decompression and further increases the speed of data reading.

It is understandable that if the data read by the host is not located in a write unit of the flash medium, then decompression is not necessary, allowing the present disclosure to increase the overall speed of data reading.

In the embodiments of the present disclosure, a data compression method applied to a flash memory device is provided. The flash memory device comprises a flash medium, and the method comprises: reading at least two pieces of cold data in the flash medium; compressing the at least two pieces of cold data in the flash medium to obtain at least two pieces of compressed data; concatenating the at least two pieces of compressed data to generate at least one write unit; and writing each write unit into the flash medium. By acquiring and compressing cold data, while leaving hot data uncompressed, this approach ensures that subsequent reads of the hot data do not require decompression, and ensures that the IO performance of the hot data is not affected, thereby enhancing the overall read IO performance of the flash memory device.

Figure 12:
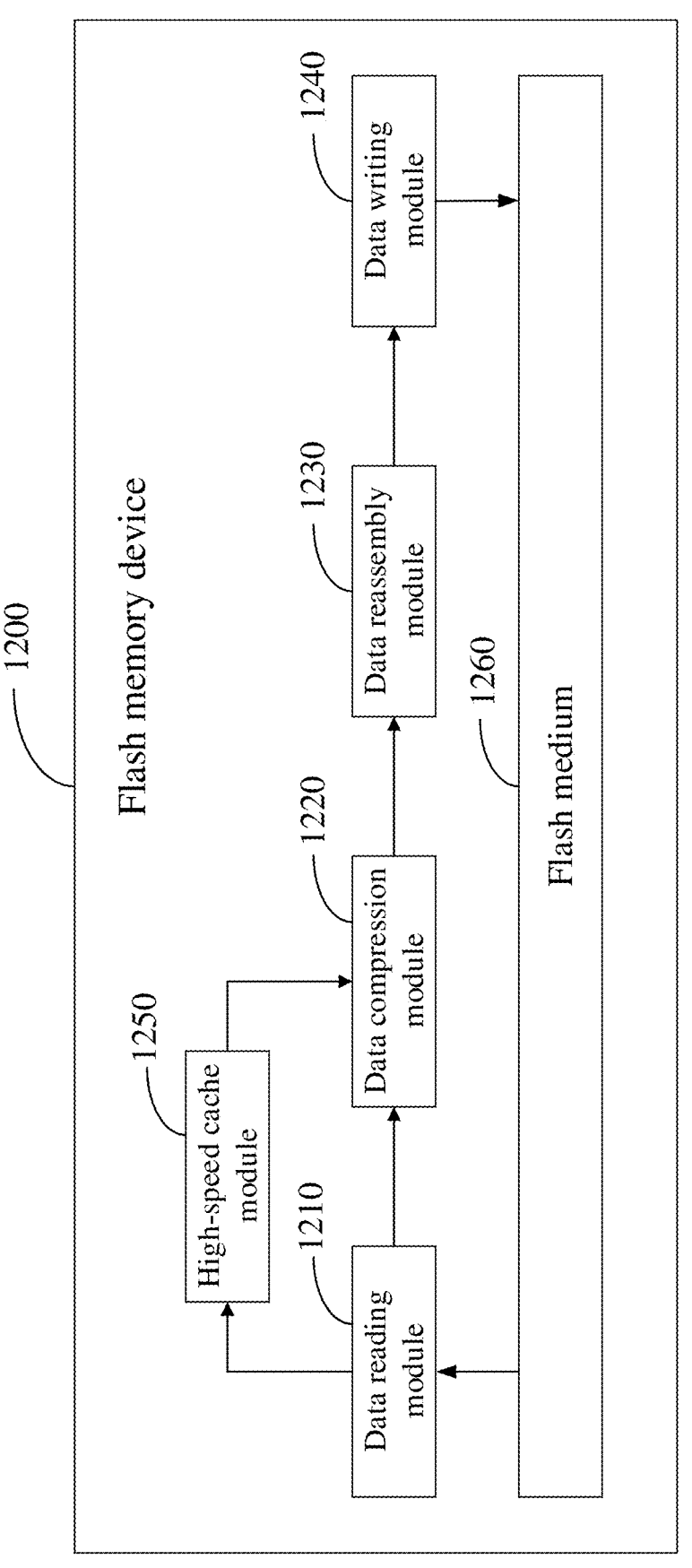
FIG. 12 is a schematic structural diagram of a flash memory device disclosed according to the embodiments of the present disclosure.

Referring to FIG. 12, FIG. 12 is a schematic structural diagram of a flash memory device disclosed according to the embodiments of the present disclosure.

As shown in FIG. 12, the flash memory device 1200 comprises a data reading module 1210, a data compression module 1220, a data reassembly module 1230, a data writing module 1240, a high-speed cache module 1250, and a flash medium 1260.

The data reading module 1210 is configured to read at least two pieces of cold data in the flash medium.

The data compression module 1220 is configured to compress at least two pieces of cold data in the flash medium to obtain at least two pieces of compressed data.

The data reassembly module 1230 is configured to concatenate at least two pieces of compressed data to generate at least one write unit.

The data writing module 1240 is configured to write each write unit into the flash medium.

The high-speed cache module 1250 connecting the data reading module 1210 and the data compression module 1220 is configured to store at least two pieces of cold data read from the flash medium by the data reading module 1210. Additionally, the data compression module 1220 compresses at least two pieces of cold data in the high-speed cache module 1250. Here, the high-speed cache module 1250 serves to temporarily store user data for the data compression module 1220.

The flash medium 1260 is configured to store user data written by the data writing module.

In some embodiments, after the data reading module 1210 reads cold data into the high-speed cache module 1250, a data compression command is constructed to send the cold data to the data compression module 1220 for compression. The cold data, after being subjected to a data compression algorithm, output compressed data along with information about the compressed length. The compressed data is then used to construct a data assembly command, and the data reassembly command is sent to the data reassembly module 1230, such that the data reassembly module 1230 assembles the compressed data. Finally, the data writing module 1240 writes the assembled write unit into the flash medium 1260.

In the embodiments of the present disclosure, both the data compression command and the data reassembly command are sent in the form of messages. The data compression algorithm may be an internally developed compression algorithm or an open-source compression algorithm integrated into the system of the flash memory device, such as the RAR and ZIP compression algorithms in the Windows interface.

It should be noted that the relevant functionalities of the data reading module 1210, data compression module 1220, data reassembly module 1230, data writing module 1240, high-speed cache module 1250, and flash medium 1260 in the aforementioned flash memory device 1200 may refer to the content mentioned in the above embodiments, which are not reiterated here.

In the embodiments of the present disclosure, a flash memory device is provided, which comprises a flash medium, a data reading module for reading at least two pieces of cold data in the flash medium; a data compression module for compressing at least two pieces of cold data in the flash medium to obtain at least two pieces of compressed data; a data reassembly module for concatenating at least two pieces of compressed data to generate at least one write unit; and a data writing module for writing each write unit into the flash medium. By acquiring and compressing cold data, while leaving hot data uncompressed, this approach ensures that subsequent reads of the hot data do not require decompression, and ensures that the IO performance of the hot data is not affected, thereby enhancing the overall read IO performance of the flash memory device.

The embodiments of the present disclosure further provide a non-volatile computer storage medium that stores computer-executable instructions. The computer-executable instructions are executed by one or more processors, and for example, the aforementioned one or more processors may execute the data compression method in any one of the method embodiments mentioned above, such as executing the data compression method in any one of the method embodiments mentioned above, and executing each of the steps described above.

The apparatus and device embodiments described above are merely illustrative, wherein the unit modules described as separate components may or may not be physically separated, and components displayed as module units may or may not be physical units; i.e., they may be located in one position, or may be distributed on multiple network module units. Some or all of the modules can be selected according to actual needs to achieve the purpose of the schemes of the embodiments.

From the descriptions of the above embodiments, those skilled in the art can clearly understand that various embodiments can be implemented through a software and general hardware platform or through hardware alone. With this understanding, the essential parts or the parts contributing to the related art in the above technical solutions can be embodied in the form of a software product. This computer software product can be stored on computer-readable storage media such as ROM/RAM, magnetic disks, and optical disks, and may comprise several instructions for causing a computer device (which may be a personal computer, a server, or a network device, etc.) to perform to perform methods of various embodiments or portions thereof.

Finally, it should be noted that the above embodiments are only intended to illustrate the technical solutions of the present disclosure and are not intended to limit them. Within the concept of the present disclosure, the technical features in the above embodiments or different embodiments may also be combined, steps may be performed in any order, and many other variations in different aspects of the present disclosure may exist, which are not provided in detail for the sake of brevity. Despite the detailed description in reference to the previous embodiments, those of ordinary skill in the art should understand that the technical solutions described in the various embodiments can still be modified or some of the technical features therein can be replaced with equivalent alternatives. Such modifications or replacements do not take the essence of the respective technical solutions outside the scope of the various embodiments of the present disclosure.

The invention claimed is:

1. A method of data compression, applied to a flash memory device comprising a flash medium, the method comprising:

reading at least two pieces of cold data in the flash medium;

compressing the at least two pieces of cold data in the flash medium to obtain at least two pieces of compressed data, respectively, wherein the at least two pieces of compressed data comprise a first piece of compress data and a second piece of compressed data;

concatenating the at least two pieces of compressed data to generate at least one write unit such that the first piece of compressed data is connected to the second piece of compressed data in one of the at least one write unit without invalid data padding in between the first and second pieces of compressed data, wherein each write unit comprises a header file comprising a logical address, a data length, and a starting position of each piece of compressed data within the corresponding write unit; and writing each of the at least one write unit into the flash medium.

2. The method according to claim 1, wherein reading the at least two pieces of cold data in the flash medium comprises:

acquiring a cold data table;

determining, based on the cold data table, multiple pieces of valid cold data within the cold data table; and reading, from the multiple pieces of valid cold data, at least two pieces of valid cold data in the flash medium.

3. The method according to claim 2, wherein determining, based on the cold data table, the multiple pieces of valid cold data within the cold data table comprises:

for each piece of cold data in the cold data table, searching for a logical address of the piece of cold data in the cold data table; and determining the piece of cold data as a piece of valid cold data if the piece of cold data meets a preset condition, wherein the preset condition comprises: the logical address belonging to valid logical addresses.

4. The method according to claim 3, further comprising determining whether the logical address belongs to the valid logical addresses at least by:

determining that the logical address belongs to the valid logical addresses if a physical address corresponding to the logical address of the piece of cold data is valid, the logical address of the piece of cold data falls within a range of logical addresses corresponding to user data in the flash medium, and the logical address of the piece of cold data has not been processed by an erase command after the piece of cold data has been written in the flash medium.

5. The method according to claim 1, wherein the flash memory device comprises a high-speed cache module, and reading the at least two pieces of cold data in the flash medium comprises:

writing the at least two pieces of cold data that have been written into the flash medium to the high-speed cache module according to a data granularity size of each piece of cold data when being written to the flash medium, wherein one piece of cold data corresponds to one data granularity size.

6. The method according to claim 5, wherein compressing the at least two pieces of cold data in the flash medium to obtain the at least two pieces of compressed data, respectively, comprises:

acquiring the at least two pieces of cold data from the high-speed cache module; and compressing the at least two pieces of cold data based on a data compression command, thereby obtaining the at least two pieces of compressed data.

7. The method according to claim 6, wherein concatenating the at least two pieces of compressed data to generate the at least one write unit comprises:

assembling the at least two pieces of compressed data based on a data reassembly command to generate the at least one write unit.

8. The method according to claim 7, wherein the at least two pieces of compressed data comprises a third piece of compressed data and a fourth piece of compressed data, and assembling the at least two pieces of compressed data based on the data reassembly command to generate the at least one write unit comprises:

concatenating the third piece of compressed data with the fourth piece of compressed data to obtain a concatenation unit, and determining whether a total data length of the concatenation unit is greater than a data length of one write unit;

if the total data length of the concatenation unit is greater than the data length of one write unit, discarding the fourth piece of compressed data from the concatenation unit, considering the concatenation unit including the third piece of compressed data as one write unit, and using the fourth piece of compressed data as a piece of compressed data in a new concatenation unit to continue the concatenation; and if the total data length of the concatenation unit is not greater than the data length of one write unit, continuing to concatenate another piece of compressed data to the concatenation unit until the total data length of the concatenation unit is greater than the total data length of one write unit.

9. The method according to claim 8, further comprising:

after discarding the fourth piece of compressed data, and if the total data length of the concatenation unit is less than the total data length of one write unit, filling the concatenation unit with dummy data to make the total data length of the concatenation unit equal to the total data length of one write unit.

10. The method according to claim 7, further comprising:

when reading data in the flash medium, and if the data is located in a write unit, decompressing the write unit, and determining, based on a header file of the write unit, a starting position and a data length of the data to read compressed data within the write unit.

11. A flash memory device, comprising:

a flash medium; and a processor configured to perform operations comprising:

reading at least two pieces of cold data in the flash medium;

compressing the at least two pieces of cold data in the flash medium to obtain at least two pieces of compressed data, respectively, wherein the at least two pieces of compressed data comprise a first piece of compress data and a second piece of compressed data;

concatenating the at least two pieces of compressed data to generate at least one write unit such that the first piece of compressed data is connected to the second piece of compressed data in one of the at least one write unit without invalid data padding in between the first and second pieces of compressed data, wherein each write unit comprises a header file comprising a logical address, a data length, and a starting position of each piece of compressed data within the corresponding write unit; and writing each of the at least one write unit into the flash medium.

12. The flash memory device according to claim 11, further comprising:

a high-speed cache module configured to store the at least two pieces of cold data read from the flash medium.

13. The flash memory device according to claim 11, wherein reading the at least two pieces of cold data in the flash medium comprises:

acquiring a cold data table;

determining, based on the cold data table, multiple pieces of valid cold data within the cold data table; and reading, from the multiple pieces of valid cold data, at least two pieces of valid cold data in the flash medium.

14. The flash memory device according to claim 13, wherein determining, based on the cold data table, the multiple pieces of valid cold data within the cold data table comprises:

for each piece of cold data in the cold data table, searching for a logical address of the piece of cold data in the cold data table; and determining the piece of cold data as a piece of valid cold data if the piece of cold data meets a preset condition, wherein the preset condition comprises: the logical address belonging to valid logical addresses.

15. The flash memory device according to claim 14, wherein the operations further comprise determining whether the logical address belongs to the valid logical addresses at least by:

determining that the logical address belongs to the valid logical addresses if a physical address corresponding to the logical address of the piece of cold data is valid, the logical address of the piece of cold data falls within a range of logical addresses corresponding to user data in the flash medium, and the logical address of the piece of cold data has not been processed by an erase command after the piece of cold data has been written in the flash medium.

16. The flash memory device according to claim 12, wherein reading the at least two pieces of cold data in the flash medium comprises:

writing the at least two pieces of cold data that have been written into the flash medium to the high-speed cache module according to a data granularity size of each piece of cold data when being written to the flash medium, wherein one piece of cold data corresponds to one data granularity size.

17. The flash memory device according to claim 16, wherein compressing the at least two pieces of cold data in the flash medium to obtain the at least two pieces of compressed data, respectively, comprises:

acquiring the at least two pieces of cold data from the high-speed cache module; and compressing the at least two pieces of cold data based on a data compression command, thereby obtaining the at least two pieces of compressed data.

18. The flash memory device according to claim 17, wherein concatenating the at least two pieces of compressed data to generate the at least one write unit comprises:

assembling the at least two pieces of compressed data based on a data reassembly command to generate the at least one write unit.

19. The flash memory device according to claim 18, wherein the at least two pieces of compressed data comprises a third piece of compressed data and a fourth piece of compressed data, and assembling the at least two pieces of compressed data based on the data reassembly command to generate the at least one write unit comprises:

concatenating the third piece of compressed data with the fourth piece of compressed data to obtain a concatenation unit, and determining whether a total data length of the concatenation unit is greater than a data length of one write unit;

if the total data length of the concatenation unit is greater than the data length of one write unit, discarding the fourth piece of compressed data from the concatenation unit, considering the concatenation unit including the third piece of compressed data as one write unit, and using the fourth piece of compressed data as a piece of compressed data in a new concatenation unit to continue the concatenation; and if the total data length of the concatenation unit is not greater than the data length of one write unit, continuing to concatenate another piece of compressed data to the concatenation unit until the total data length of the concatenation unit is greater than the total data length of one write unit.

20. The flash memory device according to claim 19, further comprising:

after discarding the fourth piece of compressed data, and if the total data length of the concatenation unit is less than the total data length of one write unit, filling the concatenation unit with dummy data to make the total data length of the concatenation unit equal to the total data length of one write unit.

* * * * *